(12) United States Patent
Hanafusa et al.

(10) Patent No.: US 11,940,222 B2
(45) Date of Patent: Mar. 26, 2024

(54) HEAT SINK MODULE WITH THROUGH-HOLE

(71) Applicant: Sumitomo Precision Products Co., Ltd., Amagasaki (JP)

(72) Inventors: Shota Hanafusa, Amagasaki (JP); Keiji Miki, Amagasaki (JP)

(73) Assignee: Sumitomo Precision Products Co., Ltd., Amagasaki (JP)

( * ) Notice: Subject to any disclaimer, the term of this patent is extended or adjusted under 35 U.S.C. 154(b) by 88 days.

(21) Appl. No.: 16/643,725

(22) PCT Filed: Sep. 12, 2017

(86) PCT No.: PCT/JP2017/032939
§ 371 (c)(1),
(2) Date: Mar. 2, 2020

(87) PCT Pub. No.: WO2019/053791
PCT Pub. Date: Mar. 21, 2019

(65) Prior Publication Data
US 2020/0232715 A1 Jul. 23, 2020

(51) Int. Cl.
*F28D 15/02* (2006.01)
*H05K 7/20* (2006.01)

(52) U.S. Cl.
CPC ....... *F28D 15/0275* (2013.01); *H05K 7/2039* (2013.01)

(58) Field of Classification Search
CPC ........ F28D 15/0275; F28D 2021/0029; H05H 7/203; H05K 7/203; F28F 3/048; F28F 1/128; F28F 1/38
See application file for complete search history.

(56) References Cited

U.S. PATENT DOCUMENTS

| | | | |
|---|---|---|---|
| 2007/0187069 A1 | 8/2007 | Ueno et al. | |
| 2007/0223196 A1 | 9/2007 | Kuo et al. | |
| 2007/0285894 A1* | 12/2007 | Hatamian | F28D 15/00 361/710 |
| 2008/0302509 A1* | 12/2008 | Chen | F21V 29/71 165/80.3 |

(Continued)

FOREIGN PATENT DOCUMENTS

| | | | |
|---|---|---|---|
| CN | 207865339 U * | 9/2018 | ............ F21V 29/503 |
| JP | 5-275582 A | 10/1993 | |

(Continued)

OTHER PUBLICATIONS

Japanese-language Office Action issued in Japanese Application No. 2019-541526 dated Apr. 20, 2021 with English translation (13 pages).

(Continued)

*Primary Examiner* — Harry E Arant
(74) *Attorney, Agent, or Firm* — Crowell & Moring LLP

(57) ABSTRACT

A heat sink includes a plurality of extrusions each including a base and a fin, the plurality of extrusions being aligned in a width direction orthogonal to an extrusion direction and joined to each other. The plurality of extrusions include a first extrusion including a plurality of fins, the first extrusion including, in the base, a through-hole in which a heat pipe is mountable, the through-hole extending in the extrusion direction.

6 Claims, 8 Drawing Sheets

(56) References Cited

U.S. PATENT DOCUMENTS

| | | | | |
|---|---|---|---|---|
| 2010/0032137 A1* | 2/2010 | Huang | ............... | F28D 15/0275 |
| | | | | 165/104.26 |
| 2013/0175019 A1* | 7/2013 | Phelan | ............... | F28D 15/0275 |
| | | | | 29/890.032 |
| 2013/0180688 A1* | 7/2013 | Lin | ........... | F28F 13/18 |
| | | | | 165/104.26 |
| 2015/0136363 A1* | 5/2015 | Huang | ..................... | F28F 3/02 |
| | | | | 165/104.26 |
| 2016/0128234 A1* | 5/2016 | Uesugi | ................. | H01L 23/427 |
| | | | | 361/700 |

FOREIGN PATENT DOCUMENTS

| | | | | |
|---|---|---|---|---|
| JP | 8-181258 A | 7/1996 | | |
| JP | 10-107466 A | 4/1998 | | |
| JP | 10-224068 A | 8/1998 | | |
| JP | 2000-150738 A | 5/2000 | | |
| JP | 2003-318338 A | 11/2003 | | |
| JP | 2006-32798 A | 2/2006 | | |
| JP | 2007019365 | * | 1/2007 ............ | H01L 23/36 |
| JP | 5756332 B2 | 7/2015 | | |

OTHER PUBLICATIONS

International Search Report (PCT/ISA/210) issued in PCT Application No. PCT/JP2017/032939 dated Dec. 19, 2017 with English translation (four pages).

Japanese-language Written Opinion (PCT/ISA/237) issued in PCT Application No. PCT/JP2017/032939 dated Dec. 19, 2017 (four pages).

* cited by examiner (A)

(B)

(C)

(D)

HEAT SINK MODULE WITH THROUGH-HOLE

TECHNICAL FIELD

The present invention relates to a heat sink.

BACKGROUND ART

Conventionally, a heat sink configured by joining extrusions is known. Such a heat sink is disclosed in Japanese Patent Laid-Open No. 8-181258, for example.

Japanese Patent Laid-Open No. 8-181258 discloses a heat sink in which extrusions including plate-shaped fins and substrate components connected to the lower ends of the plate-shaped fins are aligned, and the substrate components are joined to each other by brazing. The individual extrusions are formed according to the length of the heat sink, and the extrusions are aligned side by side to form the heat sink with a desired size.

PRIOR ART

Patent Document
Patent Document 1: Japanese Patent Laid-Open No. 8-181258

SUMMARY OF THE INVENTION

Problem to be Solved by the Invention

In a large-sized heat sink in which a plurality of objects to be cooled are installed, a heat pipe may be provided inside the heat sink so as to straddle an installation region of the plurality of objects to be cooled. This is because even when the plurality of objects to be cooled have different heat loads, the heat loads are dispersed by the heat pipe to significantly reduce or prevent a local temperature rise.

When the heat pipe is provided in the heat sink disclosed in Japanese Patent Laid-Open No. 8-181258, it is necessary to form heat pipe mounting holes in the substrate components by machining after the extrusions are joined to each other to form the heat sink. Therefore, there is a problem that the number of manufacturing steps increases. As the number of manufacturing steps increases, the manufacturing cost also increases.

The present invention has been proposed in order to solve the aforementioned problem, and one object of the present invention is to provide a heat sink configured by joining extrusions, in which an increase in the number of manufacturing steps is significantly reduced or prevented even when a heat pipe is mountable inside the heat sink.

Means for Solving the Problem

In order to attain the aforementioned object, a heat sink according to the present invention includes a plurality of extrusions each including a base and a fin that protrudes from the base, the plurality of extrusions being aligned in a width direction orthogonal to an extrusion direction and joined to each other, and the plurality of extrusions include a first extrusion including a plurality of fins, the first extrusion including, in the base, a through-hole in which a heat pipe is mountable, the through-hole extending in the extrusion direction.

In the heat sink according to the present invention, the through-hole in which the heat pipe is mountable is provided in advance in the first extrusion obtained by extrusion molding, and thus the through-hole for mounting the heat pipe can be provided in the heat sink simply by aligning and joining the plurality of extrusions including the first extrusion. Accordingly, even when the heat pipe is mountable inside the heat sink, an increase in the number of manufacturing steps can be significantly reduced or prevented as compared with the case in which a hole for mounting the heat pipe is formed by post-processing. The manufacturing cost can also be reduced by significantly reducing or preventing an increase in the number of manufacturing steps. Furthermore, even when the heat pipe is not provided in the through-hole, a portion of the first extrusion can be hollowed due to the through-hole, and thus the weight of the heat sink can be reduced. In addition, similarly to the case in which the through-hole is provided by post-processing, the position of the through-hole can be adjusted by adjusting the position of the first extrusion and/or the number of first extrusions in the arrangement of the plurality of extrusions such that the through-hole passes through a position that overlaps a plurality of locations with different heat loads. Alternatively, when all the extrusions are the first extrusions, the through-hole that passes through the position that overlaps the locations with different heat loads can be selected as a through-hole in which the heat pipe is mounted. Consequently, the heat pipe is mounted in the through-hole arranged at an appropriate position, and thus it is possible to effectively disperse the heat load and significantly reduce or prevent a local temperature rise.

In the heat sink according to the present invention, a dimension of the through-hole in the width direction preferably has a size equal to or larger than a pitch of the plurality of fins. In the first extrusion including the plurality of fins, the dimension of the base in the width direction is equal to or larger than the pitch of the fins. Therefore, using that the dimension of the base in the width direction is equal to or larger than the pitch of the fins in the first extrusion including the plurality of fins, the relatively large-sized through-hole having a size equal to or larger than the pitch of the fins can be provided in the first extrusion. Consequently, a mold can be simplified, and the through-hole can be easily formed as compared with the configuration in which many small-sized through-holes that have the same total cross-sectional area and are smaller than the pitch of the fins are provided, for example.

In the heat sink according to the present invention, the first extrusion preferably includes one or two through-holes. When a large number of through-holes are provided in the first extrusion, the mold structure becomes complicated, and the manufacturing cost increases. In addition, when the heat pipe is mounted, the number of heat pipes increases, and thus the number of components tends to increase. Thus, one or two through-holes are provided in the first extrusion such that excessive complication of the mold structure can be significantly reduced or prevented, and an excessive increase in the number of components can be significantly reduced or prevented even when the heat pipe is mounted.

In the heat sink according to the present invention, the plurality of extrusions including the first extrusion each preferably include six or less fins. When the extrusions each include a large number of fins, the extrusions themselves tend to be large, and the mold becomes large and complicated. Consequently, the manufacturing cost and the manufacturing difficulty tend to increase. Therefore, the number of fins provided on each of the extrusions is set to six or less such that excessive increases in the manufacturing cost and the manufacturing difficulty can be significantly reduced or prevented.

In the heat sink according to the present invention, the first extrusion preferably includes three or four fins and the base including one or two through-holes formed therein. Accordingly, three or four fins are provided such that increases in the manufacturing cost and the manufacturing difficulty can be further effectively significantly reduced or prevented as compared with the case in which five or six fins are provided. Furthermore, the width of the base can be made larger as compared with the case in which two fins are provided, and thus one or two through-holes can be easily made larger. When three fins are provided, one through-hole is preferably provided because a space for forming a through-hole with a diameter equal to or larger than the pitch of the fins can be easily ensured.

The heat sink according to the present invention preferably further includes a heat pipe selectively mounted in the through-hole. Accordingly, even when a relatively large-sized heat sink is formed by joining the plurality of extrusions, the temperature distribution of the heat sink can be homogenized by the heat pipe. Therefore, in the heat sink, a local temperature rise can be significantly reduced or prevented even when there are locations with different heat loads. In the configuration in which the plurality of first extrusions are provided, the through-hole of the first extrusion that passes through the locations with different heat loads can be selected, and the heat pipe can be mounted therein. Thus, the local temperature rise of the heat sink can be effectively significantly reduced or prevented.

In the heat sink according to the present invention, the plurality of extrusions preferably include a second extrusion including the base having a width dimension different from a width dimension of the first extrusion. When a plurality of same first extrusions are aligned, for example, a distance between the through-holes is also constant, but when the second extrusion including the base having a different width dimension is interposed between the first extrusions, the distance between the through-holes can be changed. Therefore, the position of the through-hole can be more precisely adjusted according to the locations with different heat loads by adjusting not only the position of the first extrusion in the arrangement of the plurality of extrusions but also the position of the second extrusion and/or the number of second extrusions. Consequently, the local temperature rise of the heat sink can be more effectively significantly reduced or prevented by adjusting the position of the through-hole such that the through-hole passes through the locations with different heat loads in the heat sink and mounting the heat pipe in the through-hole, the position of which has been adjusted.

Effect of the Invention

In the heat sink configured by joining the extrusions, an increase in the number of manufacturing steps can be significantly reduced or prevented even when the heat pipe is mountable inside the heat sink.

MODES FOR CARRYING OUT THE INVENTION

An embodiment of the present invention is hereinafter described on the basis of the drawings.

(Overall Configuration of Heat Sink)

A heat sink 100 according to the embodiment is described with reference to FIGS. 1 to 5. The heat sink 100 is a cooler mounted on an object to be cooled, which is a heating element, and cooling the object to be cooled. The heat sink 100 cools the object to be cooled by absorbing heat from a mounting position of the object to be cooled and radiating heat to the outside of the heat sink 100.

Figure 1:
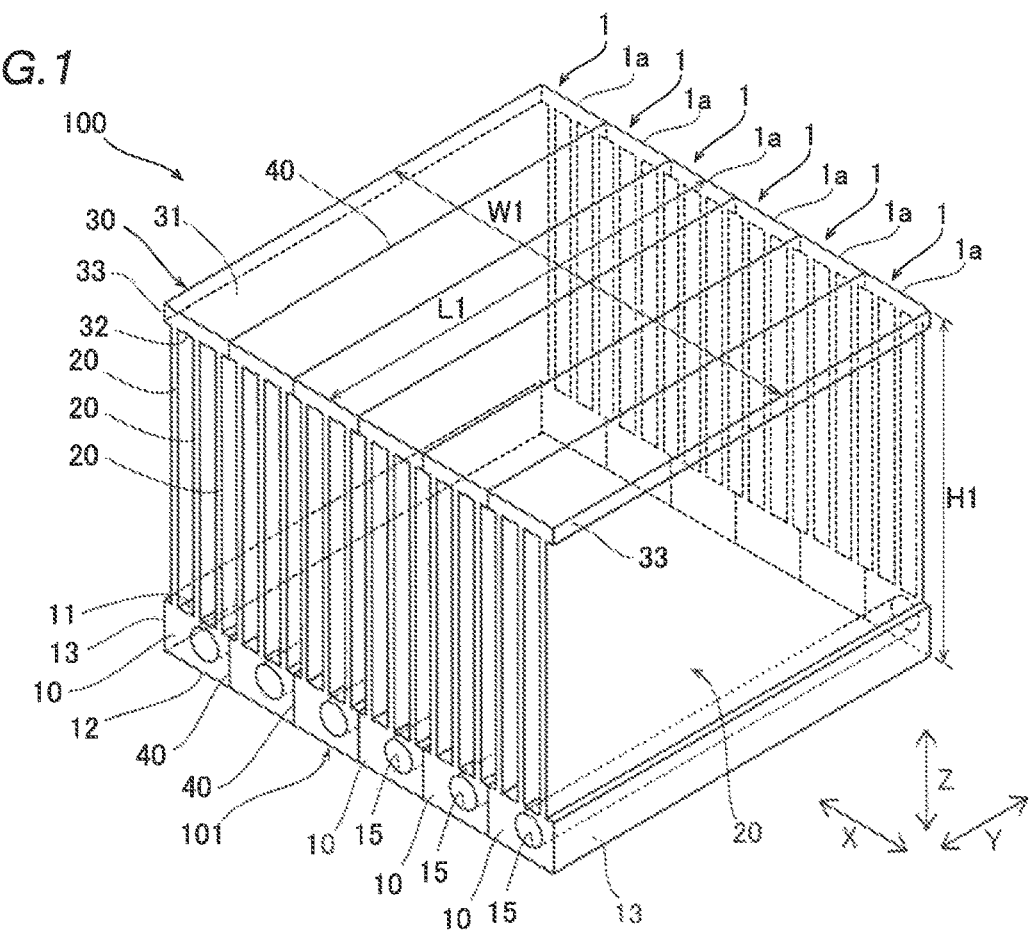
FIG. 1 is a perspective view schematically showing a heat sink according to the present embodiment.

The heat sink 100 shown in FIG. 1 includes a plurality of extrusions 1 each including a base 10 and a plurality of fins 20 that protrude from the base 10.

The extrusions 1 are mold materials formed by extrusion molding, and are made of a metal material. The metal material is aluminum or an aluminum alloy, for example, and a material having high thermal conductivity is preferable. In the extrusion molding, the metal material is extruded in a predetermined direction (extrusion direction, Y direction) using a mold such that a mold material having a desired sectional shape that extends in the extrusion direction is integrally formed. Therefore, the extrusions 1 each integrally include the base 10 and the plurality of fins 20.

The extrusions 1 each have a shape that extends in the extrusion direction as described above. In the cross-section orthogonal to the extrusion direction, a direction (Z direction) in which the fins 20 rise from the base 10 is defined as a height direction, and a direction (X direction) orthogonal to the height direction is defined as a width direction. The extrusions 1 each have a dimension of a width W2 (see FIG. 2) and a height H1. The length L1 of each of the extrusions 1 in the extrusion direction is set to correspond to the dimension of the heat sink 100. The plurality of extrusions 1 are aligned in the X direction and joined to each other to form the heat sink 100 having a length L1 as one of vertical and horizontal sizes and a length W1 corresponding to the number of arrangements of the extrusions 1 as the other of the vertical and horizontal sizes. The length L1 of each of the extrusions 1 and the number of arrangements are changed such that the heat sink 100 having a desired size can be configured.

The plurality of extrusions 1 that constitute the heat sink 100 are aligned in the X direction orthogonal to the Y direction, joined to each other, and integrated. Specifically, among the plurality of extrusions 1 aligned in the X direction, adjacent extrusions 1 are connected to each other in the X direction. The plurality of extrusions 1 are joined by brazing, for example. The extrusions 1 may be joined to each other by welding, for example.

The extrusions 1 shown in FIG. 1 each integrally include the base 10, the fins 20, and a reinforcer 30.

The base 10 has a flat plate shape that extends in the X direction and has a predetermined thickness in the Z direction. In an example of FIG. 2, the base 10 has a rectangular cross-sectional shape. The base 10 has a width dimension W2 larger than its height dimension H2, and has a horizontally long rectangular cross-section. The base 10 extends in the Y direction. The base 10 includes a first surface 11 and a second surface 12 on both sides in the Z direction, and a pair of side surfaces 13 on both sides in the X direction. The first surface 11 and the second surface 12 are flat surfaces substantially parallel to each other. However, the shapes of the first surface 11 and the second surface 12 do not need to be flat. The pair of side surfaces 13 are flat surfaces substantially parallel to each other. In the plurality of extrusions 1, side surfaces 13 of bases 10 adjacent to each other are joined to each other. A brazing material 40 having a lower melting point than that of a constituent material of the extrusions 1 is interposed between the plurality of extrusions 1. A material of the brazing material 40 is not particularly limited, but generally, the same type of material as the constituent material of the extrusions 1 (in the case of an aluminum alloy, an aluminum brazing material) is used. As the brazing material, a cladding material (brazing sheet) in which a brazing material having a low melting point is clad on both surfaces of a flat-plate shaped core material may be used.

The heat sink 100 includes a flat mounting surface 101 formed by the second surface 12 of each base 10. An object to be cooled 102 is mounted on the mounting surface 101. Therefore, the shape of the second surface 12 corresponds to the shape of the object to be cooled 102. For example, the mounting surface 101 and a surface of the object to be cooled 102 are flat so as to be in close contact with each other as much as possible. The second surface 12 may be a non-flat surface including a step (a concave portion or a convex portion) fitted into the object to be cooled 102, for example. The heat sink 100 absorbs the heat of the object to be cooled 102 through the base 10 and radiates the heat from each fin 20.

The plurality of fins 20 are formed in such a manner as to rise from the base 10. The plurality of fins 20 are connected to the first surface 11 of the base 10 at one end in the Z direction. Each fin 20 has a flat plate shape that extends in the Z direction and the Y direction. Each fin 20 has a substantially constant thickness over the entire fin 20. The thicknesses of the fins 20 are substantially the same as each other. The plurality of fins 20 are provided substantially parallel to each other. Each fin 20 includes a pair of side surfaces 21 on both sides in the X direction. The pair of side surfaces 21 are substantially parallel to each other. The plurality of fins 20 are connected to the reinforcer 30 at the other end in the Z direction.

The plurality of fins 20 are spaced from each other in the X direction. The plurality of fins 20 are equally spaced at a predetermined pitch P (>0) in the X direction. Note that the pitch P of the fins 20 is a distance between the centers of the adjacent fins 20 in the X direction.

The plurality of fins 20 are provided in such a manner that a pitch P of fins 20 of adjacent extrusions 1 also substantially matches. Therefore, the plurality of fins 20 are provided in such a manner that pitches P are substantially constant over the entire heat sink 100. Note that the pitch of the fins 20 of the adjacent extrusions 1 does not need to be strictly constant, and an error corresponding to the thickness of the brazing material 40 after brazing is allowable.

The reinforcer 30 has a flat plate shape that extends in the X direction and has a predetermined thickness in the Z direction. The reinforcer 30 has a rectangular cross-sectional shape. The reinforcer 30 has a width dimension larger than its height dimension, and has a horizontally long rectangular cross-section. The width dimension of the reinforcer 30 is substantially equal to the width dimension W2 of the base 10. The height dimension (thickness) of the reinforcer 30 is smaller than the height dimension (thickness) H2 of the base 10. The reinforcer 30 extends in the Y direction. The reinforcer 30 includes a first surface 31 and a second surface 32 on both sides in the Z direction, and a pair of side surfaces 33 on both sides in the X direction. The first surface 31 and the second surface 32 are flat surfaces substantially parallel to each other. The first surface 31 and the second surface 32 may be non-flat surfaces or may not be parallel to each other. The pair of side surfaces 33 are flat surfaces substantially parallel to each other. In the plurality of extrusions 1, side surfaces 33 of reinforcers 30 adjacent to each other are joined to each other.

As described above, the plurality of extrusions 1 are joined to each other on the side surfaces 13 of the bases 10 and the side surfaces 33 of the reinforcers 30. The side surfaces 13 of the bases 10 and the side surfaces 33 of the reinforcers 30 are both arranged on the same plane (ZY plane) (the positions in the X direction are aligned). Note that the side surfaces 13 and the side surfaces 33 are joints for joining the extrusions 1 to each other, and thus as long as the side surfaces 13 and the side surfaces 33 have joint shapes according to a joining method, the side surfaces 13 and the side surfaces 33 may be surfaces other than flat surfaces. The base 10 and the reinforcer 30 have the largest width dimension in each of the extrusions 1. The width dimension of each of the extrusions 1 coincides with the width dimension W2 of the base 10 and the reinforcer 30.

The plurality of extrusions 1 each include a first extrusion 1a including a through-hole 15 that extends in the Y direction and is formed in the base 10 in such a manner that a heat pipe 50 is mountable in the through-hole 15.

Figure 2:
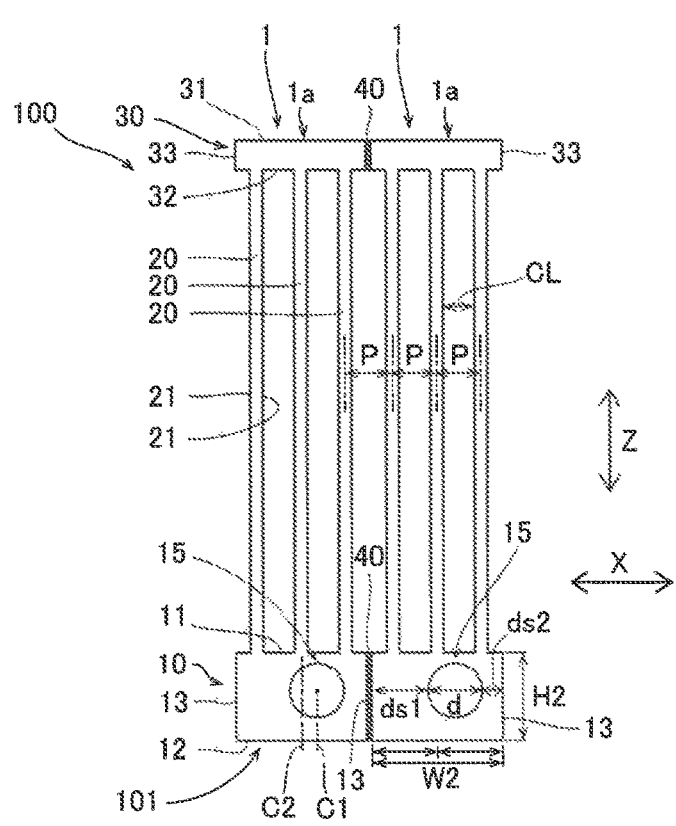
FIG. 2 is a front view schematically showing two extracted extrusions.

FIGS. 1 and 2 show an example in which the plurality of extrusions 1 that constitute the heat sink 100 are the first extrusions 1a including the through-holes 15. Some of the plurality of extrusions 1 may be the first extrusions 1a including the through-holes 15, and the remaining extrusions 1 may be extrusions 1 including no through-hole 15. For example, at both ends of the heat sink 100 in the X direction, structures (such as ribs, flanges, protrusions, or bracket-shaped portions) for fixing the heat sink 100 may be provided, and thus extrusions each having a shape different from those of the other extrusions 1 may be arranged. Therefore, the extrusions 1 each including no through-hole 15 and including a fixing structure may be provided separately from the first extrusions 1a at both ends of the heat sink 100 in the X direction, for example. At least one first extrusion 1a is provided in the heat sink 100. Preferably, a plurality of first extrusions 1a are provided.

The first extrusion 1a includes one or two through-holes 15, for example. In FIGS. 1 and 2, the first extrusion 1a includes one through-hole 15.

The through-hole 15 passes through the base 10 in the Y direction. The through-hole 15 extends linearly in the Y direction. The through-hole 15 is formed in the base 10 by extrusion molding. Therefore, the first extrusion 1a is used for some or all of the plurality of extrusions 1 that constitute the heat sink 100 such that the through-hole 15 in which the heat pipe is mountable is formed in the heat sink 100 without post-processing simply by joining the plurality of extrusions 1.

The through-hole 15 has a circular cross-sectional shape. The through-hole 15 has an inner diameter d. The through-hole 15 has a circular cross-section, and thus the width dimension (the dimension in the X direction) of the through-hole 15 matches the inner diameter d. For example, the inner diameter d is larger than ½ of the height dimension H2 of the base 10. The inner diameter d of the through-hole 15 is not less than 5 mm and not more than 50 mm, for example. The through-hole 15 is formed at a position deviated to any side surface 13 of the base 10 in the X direction. That is, the center C1 of the through-hole 15 is arranged at a position deviated in the X direction from the center C2 of the base 10 in the X direction. The center C1 of the through-hole 15 and the center C2 of the base 10 in the X direction may coincide with each other in the X direction.

The dimension d of the through-hole 15 in the X direction is larger than a clearance CL between the plurality of fins 20. Preferably, the dimension d of the through-hole 15 in the X direction is equal to or larger than the pitch P of the plurality of fins 20. The through-hole 15 is formed in such a manner as to straddle between two fins 20. That is, the through-hole 15 is formed in such a manner as to overlap the plurality of fins 20 in the Z direction. The dimension d of the through-hole 15 in the X direction is not less than one time and not more than two times the pitch P of the plurality of fins 20, for example.

The dimension d of the through-hole 15 in the X direction is ⅔ or less of the width dimension W2 of the base 10, and is preferably ½ or less of the width dimension W2 of the base 10. In the example of FIG. 2, a distance Ds1 between the through-hole 15 and one side surface 13 of the base 10 is substantially equal to the dimension d of the through-hole 15 in the X direction. A distance Ds2 between the through-hole 15 and the other side surface 13 of the base 10 is smaller than the dimension d of the through-hole 15 in the X direction. The dimension d of the through-hole 15 in the X direction is ⅕ or more and ½ or less of the width dimension W2 of the base 10, for example.

The plurality of extrusions 1 including the first extrusion(s) 1a each include six or less fins 20. In FIG. 2, the first extrusion 1a includes three fins 20 and the base 10 in which one through-hole 15 is formed. Therefore, the first extrusion 1a has a sufficiently small and simple structure as a constituent unit of the heat sink 100. Furthermore, the width dimension W2 of the first extrusion 1a can be reduced, and thus when the heat sink 100 is configured by arranging the plurality of first extrusions 1a, a distance Dh (see FIG. 4) between the through-holes 15 can be sufficiently reduced. Therefore, the through-hole 15 at an appropriate position is selected, and the heat pipe is mountable.

Example of Configuration of Heat Sink

Figure 3:
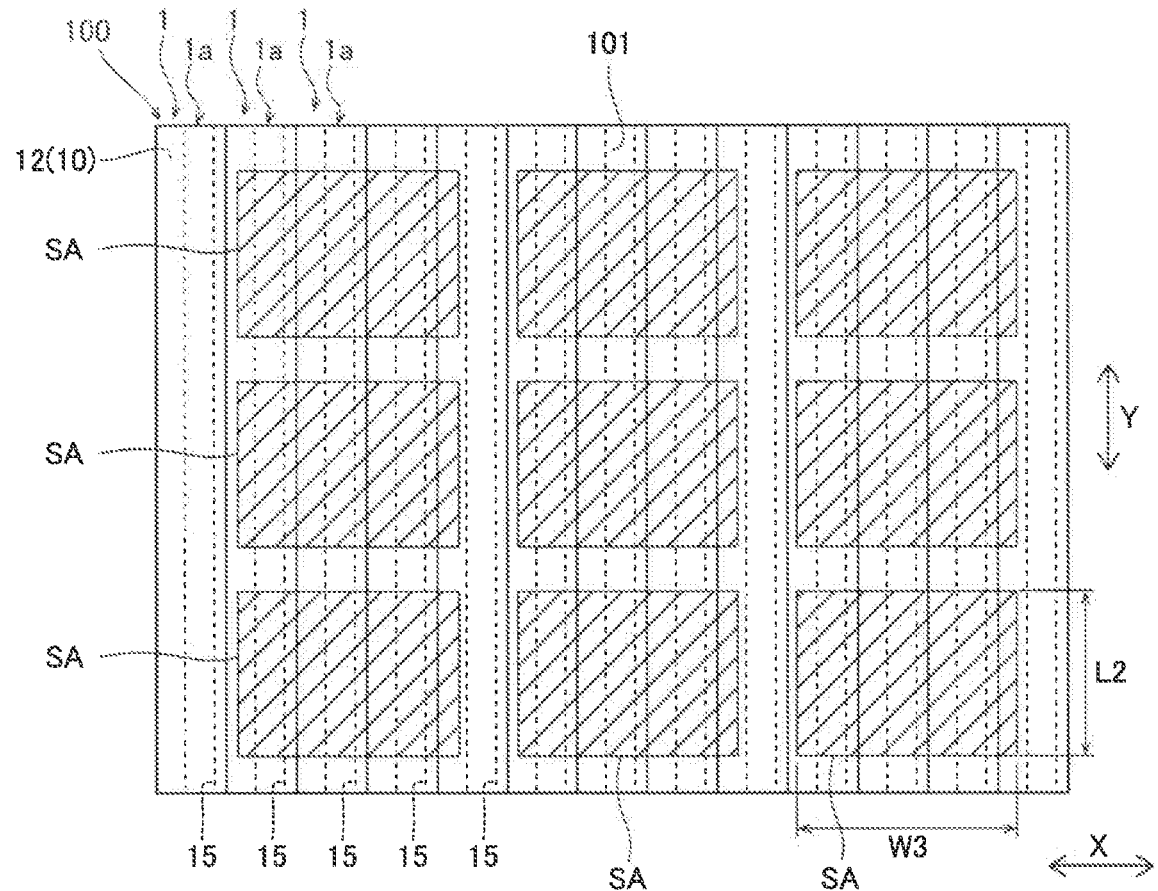
FIG. 3 is a schematic plan view for illustrating the structure of the heat sink.
Figure 4:
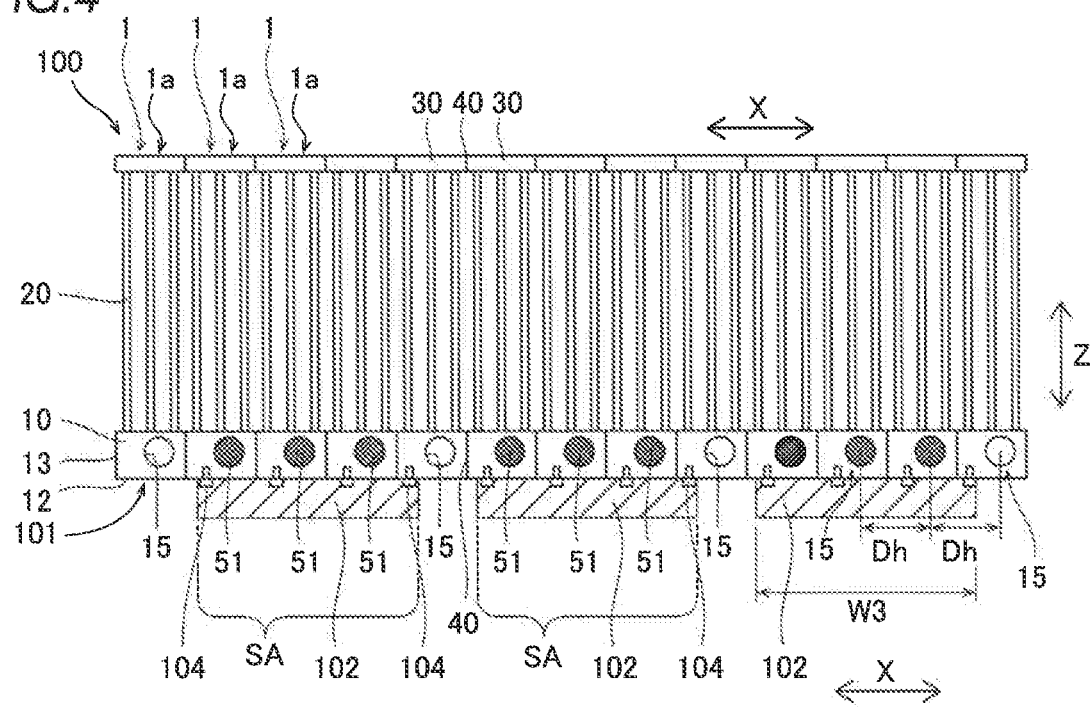
FIG. 4 is a front view of the heat sink shown in FIG. 3.

As shown in FIGS. 3 and 4, the heat sink 100 is configured in such a manner that a plurality of objects to be cooled 102 (see FIG. 4) can be installed on the mounting surface 101. The mounting surface 101 includes a plurality of rectangular installation regions SA, and the objects to be cooled 102 can be respectively mounted on the installation regions SA. The installation regions SA each have a width W3 smaller than the width W1. The installation regions SA each have a length L2 in the Y direction smaller than the length L1.

As an example, in FIG. 3, nine installation regions SA of 3 rows×3 columns are provided on the mounting surface 101. In each of the installation regions SA, the object to be cooled 102 is mounted on the base 10 using screws 104 (see FIG. 4) or the like. Although not shown, the base 10 includes tapped holes for mounting the objects to be cooled 102.

Each extrusion 1 has a length L1 that allows three installation regions SA to be aligned in the Y direction, and thirteen extrusions are provided in total in the X direction such that the heat sink 100 in which three installation regions SA can be aligned in the X direction is configured. For convenience of illustration, FIG. 1 shows a small number of extrusions 1. The total lengths of the heat sink 100 in the Y direction and in the X direction can be about several tens centimeters to several meters, for example, depending on the length and the number of arrangements of the extrusions 1, and the heat sink 100 is suitable for increasing the size. For example, the lengths L1 of the extrusions 1 in the Y direction are 10 cm or more and 5 m or less, for example. The width dimensions W2 of the extrusions 1 are 10 mm or more and 200 mm or less, for example. The height dimensions H1 of the extrusions 1 (the height dimension of the heat sink 100) are 50 mm or more and 300 mm or less, for example. The total number of extrusions 1 is not less than 5 and not more than 100, for example.

The heat sink 100 is a forced air cooling heat sink mounted on a vehicle such as an automobile or a train, an aircraft, or a marine vessel, for example, and radiating the heat of the objects to be cooled 102 due to an airflow accompanying movement. The heat sink 100 is a heat sink installed in a facility such as a factory or a plant and radiating the heat of the objects to be cooled 102 by blowing air from a blower. The airflow flows in the Y direction and passes between the plurality of fins 20 (see FIG. 4). In FIG. 3, one side in the Y direction is the upstream side of the air flow, and the other side in the Y direction is the downstream side of the air flow. The airflow absorbs heat from the fins 20 when it passes between the plurality of fins 20.

The objects to be cooled 102 are inverters used in motor drive circuits or power conversion circuits, power modules that constitute converters, or other elements or circuits that generate high heat, for example. The size of the heat sink 100, the number of installation regions SA, the arrangement of the installation regions SA, the shapes of the installation regions SA, the types of objects to be cooled 102, etc. described above are merely examples, and the size of the heat sink 100, the number of installation regions SA, the arrangement of the installation regions SA, the shapes of the installation regions SA, the types of objects to be cooled 102, etc. are not limited to those. The heat sink 100 may be a natural air cooling heat sink.

In FIG. 3, the through-hole 15 of each of the first extrusions 1a passes through the heat sink 100 in the Y direction. Furthermore, some of the thirteen through-holes 15 in total pass through positions that overlap the installation regions SA. The remaining through-holes 15 pass through positions that overlap regions other than the installation regions SA (positions between the installation regions SA in the X direction). When the first extrusion 1a including the through-hole 15 and the extrusion 1 including no through-hole 15 are mixed, the first extrusion 1a is preferably arranged at a position that overlaps the installation regions SA in the entire heat sink 100.

As shown in FIG. 4, the through-holes 15 of the first extrusions 1a are arranged at substantially equal distances Dh in the X direction. The distance Dh between the adjacent through-holes 15 is a center-to-center distance between the through-holes 15. The distance Dh between the adjacent through-holes 15 is smaller than the width dimension W3 of each of the installation regions SA. For example, the distance Dh between the adjacent through-holes 15 is smaller than ½ of the width dimension W3 of each of the installation regions SA. Therefore, in the X direction, the plurality of through-holes 15 pass through a position that overlaps the installation region SA. In an example of FIG. 4, the distance Dh between the adjacent through-holes 15 is smaller than ⅓ of the width dimension W3 of each of the installation regions SA. Therefore, three through-holes 15 are arranged in such a manner as to pass through a position that overlaps one installation region SA. Two or less or four or more through-holes 15 may be arranged at a position that overlaps one installation region SA.

As shown in FIG. 4, the heat sink 100 includes the heat pipe 50 mounted in the through-hole 15. In FIG. 4, for convenience, the through-holes 15 in which the heat pipes 50 are mounted are hatched, and the through-holes 15 in which the heat pipes 50 are not mounted are not hatched such that the presence or absence of the heat pipe 50 is shown.

The heat pipe 50 is selectively mounted in the through-hole 15. The heat pipes 50 may be mounted in all the through-holes 15, or the heat pipes 50 may not be mounted in all the through-holes 15. Preferably, one or more heat pipes 50 are provided to disperse the heat load. In FIG. 4, the heat pipes 50 are selectively mounted in the through-holes 15 that pass through positions that overlap the installation regions SA. Consequently, the heat pipes 50 are provided at positions that overlap the plurality of objects to be cooled 102 respectively mounted on the plurality of installation regions SA.

The heat pipe 50 has a structure in which a predetermined amount of hydraulic fluid (such as water) is sealed in a tube that is hermetically closed under reduced pressure. Inside the heat pipe 50, the hydraulic fluid absorbs heat from a high-temperature portion to evaporate and moves to a low-temperature portion, and a vapor flow that has moved to the low-temperature portion condenses due to heat radiation and returns, in a liquid phase state, to the high-temperature portion. Consequently, the heat pipe 50 circulates the hydraulic fluid to move heat between the high-temperature portion and the low-temperature portion. Therefore, when temperature unevenness occurs along a longitudinal direction, the heat pipe 50 transports heat from a relatively high-temperature region to a relatively low-temperature region, and homogenizes a temperature distribution.

As shown in FIG. 3, the heat pipe 50 passes through positions that overlap the three installation regions SA aligned in the Y direction, but the heat loads of the objects to be cooled 102 installed in these installation regions SA are not necessarily the same. Furthermore, the air temperature increases toward the downstream side of the air flow sent into the heat sink 100, and thus the cooling efficiency decreases. The heat pipe 50 transports the heat of the installation region SA having a relatively high temperature (a large heat load and a low cooling efficiency) to a side having a lower temperature (a small heat load and a high cooling efficiency), and the heat load of the heat sink 100 in the Y direction is made uniform.

Thus, the heat sink 100 disperses the heat load of each of the installation regions SA aligned in the Y direction by the heat pipes 50, and significantly reduces or prevents a local temperature rise. The heat pipes 50 are not mounted in the through-holes 15 that pass through positions that overlap the regions other than the installation regions SA such that an increase in the number of components can be significantly reduced or prevented, and the weight of the heat sink 100 can be reduced.

Figure 5:
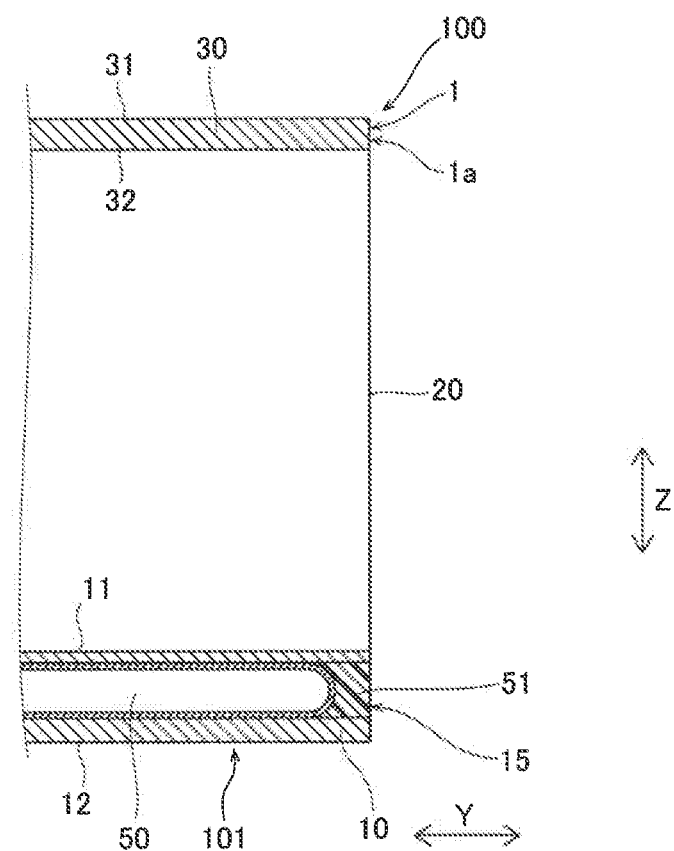
FIG. 5 is a longitudinal sectional view of the heat sink, which shows a heat pipe mounted in a through-hole.

As shown in FIG. 5, both ends of the through-hole 15 in which the heat pipe 50 is mounted are sealed with sealing materials 51. The sealing materials 51 mainly contain a synthetic resin, for example, and are filled in openings of the through-hole 15 to seal the through-hole 15. Thus, water or the like is prevented from entering the through-hole 15. Note that the sealing materials 51 are not essential, and the sealing materials 51 may not be provided in the through-hole 15.

(Method for Manufacturing Heat Sink)

Figure 6:
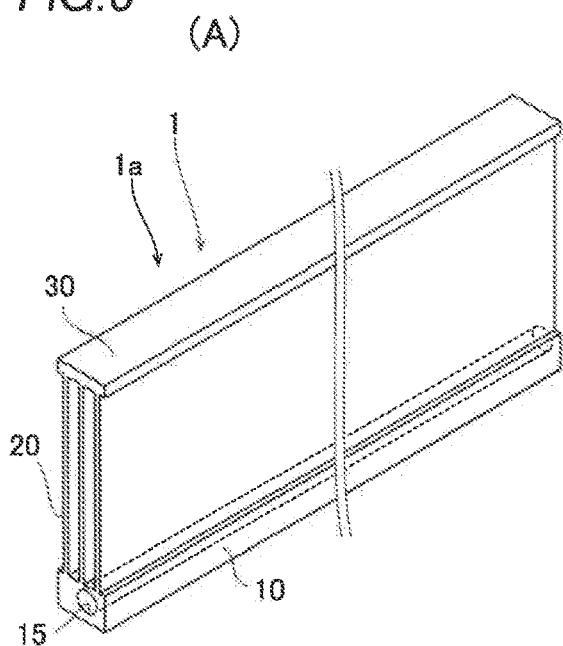
FIGS. 6A to 6D are schematic views for illustrating heat sink manufacturing steps.
Figure 6:
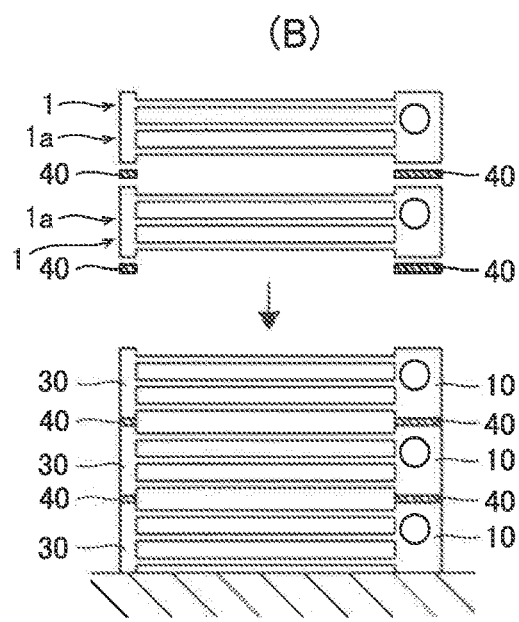
Figure 6:
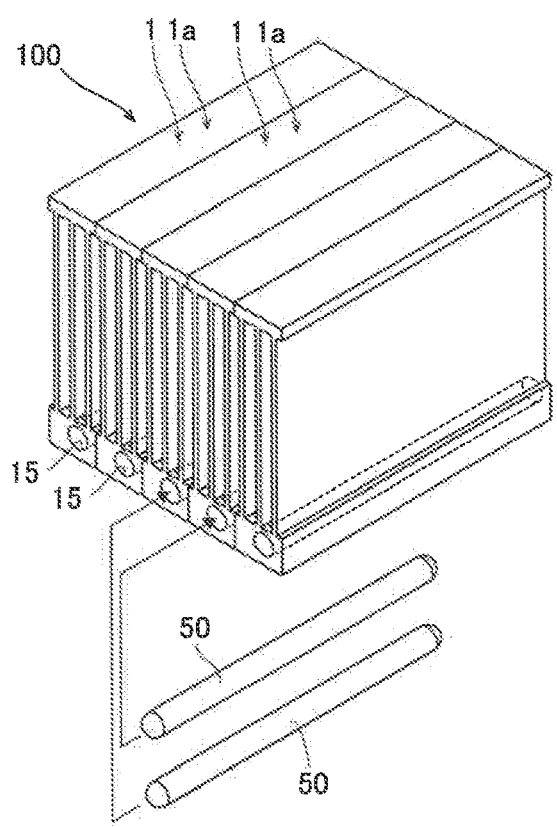
Figure 6:

An outline of a method for manufacturing the heat sink 100 according to the present embodiment is now described with reference to FIG. 6. The method for manufacturing the heat sink 100 mainly includes steps of creating the extrusions 1, joining the extrusions 1, mounting the heat pipes 50, and finishing.

First, the extrusions 1 are formed by extrusion molding. The extrusions 1 are formed using a mold for forming the cross-sectional shape shown in FIG. 2, and are cut in units of a predetermined length L1 (see FIG. 1). Thus, the extrusions 1 (first extrusions 1a) are created, as shown in FIG. 6(A). Although not shown, after the extrusion molding, the side surfaces 13 of the base 10 and the side surfaces 33 of the reinforcer 30, which are joining surfaces of the extrusions 1, are finished to a desired degree of accuracy by machining.

As shown in FIG. 6(B), the extrusions 1 are integrally joined by brazing. The extrusions 1 are stacked upward while the sheet-shaped brazing material 40 is arranged between the joining surfaces in a state in which the side surfaces 13 of the base 10 and the side surfaces 33 of the reinforcer 30, which are the joining surfaces, are laid in such a manner as to face an upward-downward direction. The plurality of extrusions 1 stacked with the brazing material 40 interposed therebetween are joined at a predetermined brazing temperature by vacuum brazing, for example. Thus, the plurality of extrusions 1 are integrated to form the heat sink 100 having a desired size.

As shown in FIG. 6(C), the heat pipe 50 is selectively mounted in the through-hole 15 of the first extrusion 1a. FIG. 6(C) shows an example in which the heat pipes 50 are mounted in the second and third through-holes 15 from the right in the figure among the five through-holes 15. After the mounting, the through-holes 15 in which the heat pipes 50 are mounted are sealed with the sealing materials 51 (see FIG. 6(D)). Although illustration is omitted, the finishing is performed by machining on the mounting surface 101 (see FIG. 6(D)) of the heat sink 100 according to the required accuracy of the mounting surface 101. Thus, the heat sink 100 is completed.

Advantageous Effects of Present Embodiment

According to the present embodiment, the following advantageous effects are achieved.

In the heat sink 100, the through-hole 15 in which the heat pipe 50 is selectively mountable is provided in advance in the first extrusion 1a obtained by extrusion molding, and thus the through-hole 15 for mounting the heat pipe 50 can be provided in the heat sink 100 simply by aligning and joining the plurality of extrusions 1 including the first extrusion(s) 1a. Accordingly, even when the heat pipe 50 is mountable inside the heat sink 100, an increase in the number of manufacturing steps can be significantly reduced or prevented as compared with the case in which a hole for mounting the heat pipe is formed by post-processing. The manufacturing cost can also be reduced by significantly reducing or preventing an increase in the number of manufacturing steps. Furthermore, even when the heat pipe 50 is not provided in the through-hole 15, a portion of the first extrusion 1a can be hollowed due to the through-hole 15, and thus the weight of the heat sink 100 can be reduced.

In the heat sink 100, all the extrusions 1 are the first extrusions 1a, and thus the through-holes 15 can be easily arranged at positions that overlap the installation regions SA. Therefore, the heat pipe 50 can be mounted by selecting the through-hole 15 at a position that overlaps the installation regions SA having different heat loads. Consequently, the heat loads can be effectively dispersed, and a local temperature rise can be significantly reduced or prevented.

In the heat sink 100, the width dimension W2 of the base 10 becomes equal to or larger than the pitch P of the fins 20 when the plurality of fins 20 are provided on the first extrusion 1a. Using this, the relatively large-sized through-hole 15 having a size equal to or larger than the pitch P of the fins 20 is provided in the first extrusion 1a. Consequently, for example, the mold can be simplified, and the through-hole 15 can be easily formed as compared with the configuration in which many small-sized through-holes that have the same total cross-sectional area and are smaller than the pitch P of the fins 20 are provided.

The dimension d of the through-hole 15 in the X direction is not more than ⅔ of the width dimension of the base 10, and thus the through-hole 15 does not become excessively large. When the objects to be cooled 102 are mounted on the bases 10, tapped holes for mounting may be provided. Even when the through-hole 15 is formed, a sufficient space for providing tapped holes or the like in the bases 10 can be ensured. The dimension d of the through-hole 15 in the X direction is preferably equal to or less than ½ of the width dimension of the base 10 because a space for providing tapped holes or the like can be further ensured.

One through-hole 15 is provided in the first extrusion 1a, and thus excessive complication of the mold structure can be significantly reduced or prevented, and an excessive increase in the number of components can be significantly reduced or prevented even when the heat pipe 50 is mounted.

The number of fins 20 provided on the extrusion 1 is set to six or less such that excessive increases in the manufacturing cost and the manufacturing difficulty can be significantly reduced or prevented.

Three fins 20 are provided on the first extrusion 1a such that increases in the manufacturing cost and the manufacturing difficulty can be further effectively significantly reduced or prevented as compared with the case in which five or six fins 20 are provided. Furthermore, the width of the base 10 can be made larger as compared with the case in which two fins 20 are provided, and thus the through-hole 15 can be easily made larger. In addition, one through-hole 15 is provided in the first extrusion 1a such that a large-sized through-hole 15 having a size equal to or larger than the pitch P of the fins 20 can be easily formed even when three fins 20 are provided.

The heat pipe 50 selectively mounted in the through-hole 15 is provided such that even when a relatively large-sized heat sink 100 is formed by joining the plurality of extrusions 1, the temperature distribution of the heat sink 100 can be homogenized by the heat pipe 50. Therefore, in the heat sink 100, a local temperature rise can be significantly reduced or prevented even when there are locations (installation regions SA) with different heat loads. In the configuration in which the plurality of first extrusions 1a are provided, the through-holes 15 at the positions that overlap the installation regions SA having different heat loads can be selected, and the heat pipes 50 can be mounted. Thus, the local temperature rise of the heat sink 100 can be effectively significantly reduced or prevented.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

Figure 7:
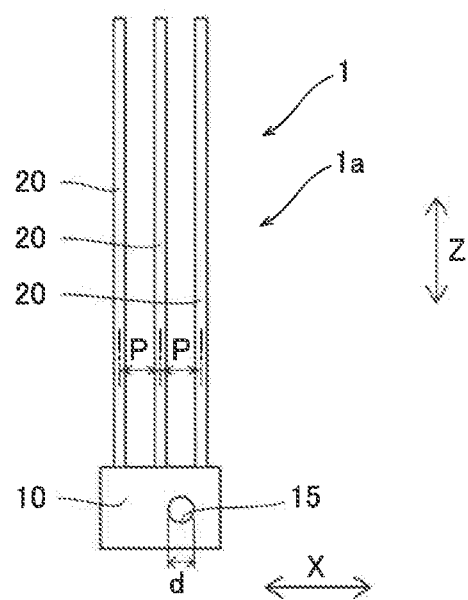
FIG. 7 is a front view showing a first modified example of an extrusion.

For example, while the example in which the extrusion 1 includes the reinforcer 30 has been shown in the aforementioned embodiment, the present invention is not restricted to this. As shown in FIG. 7, the extrusion 1 does not need to include the reinforcer 30. In FIG. 7, each of the plurality of fins 20 is continuous with the base 10 at one end, and the other end is open.

While the example in which the dimension d of the through-hole 15 in the X direction is equal to or larger than the pitch P of the plurality of fins 20 has been shown in the aforementioned embodiment, the present invention is not restricted to this. As shown in FIG. 7, the dimension d of the through-hole 15 in the X direction may be smaller than the pitch P.

Figure 8:
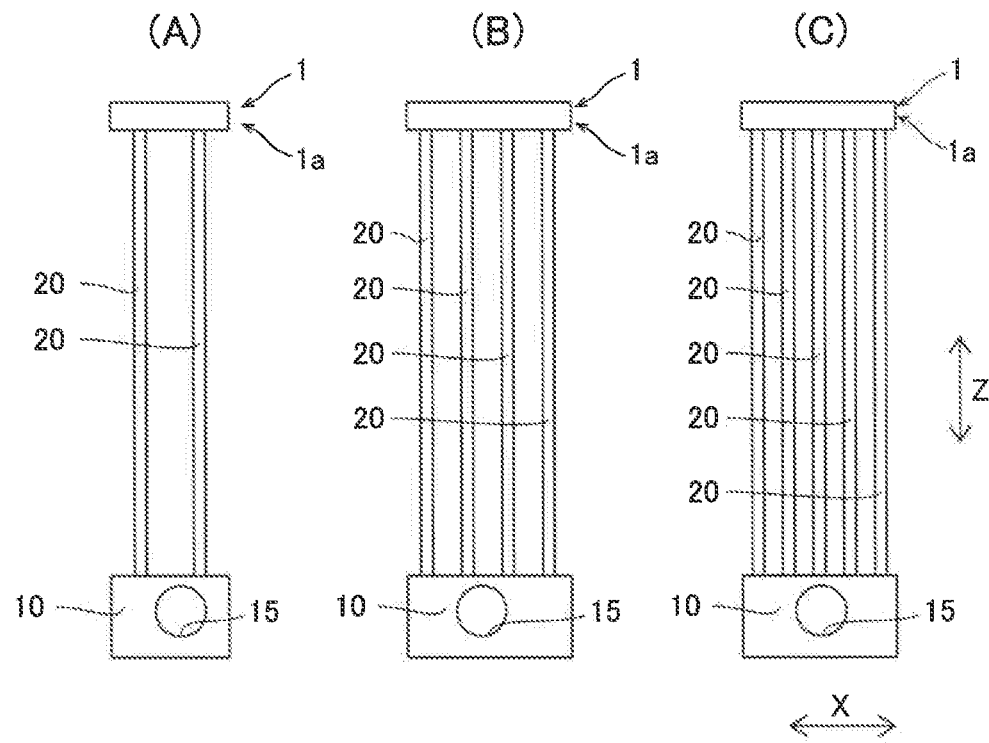
FIGS. 8A to 8C are diagrams showing modified examples of an extrusion, which include different numbers of fins.

While the example of the extrusion 1 (first extrusion 1a) including three fins 20 has been shown in the aforementioned embodiment, the present invention is not restricted to this. In an example of FIG. 8(A), the extrusion 1 (first extrusion 1a) includes two fins 20. In an example of FIG. 8(B), the extrusion 1 (first extrusion 1a) includes four fins 20. In an example of FIG. 8(C), the extrusion 1 (first extrusion 1a) includes five fins 20. In an example of FIG. 9, the extrusion 1 (first extrusion 1a) includes six fins 20. The extrusion 1 (first extrusion 1a) may include seven or more fins 20. However, when seven or more fins 20 are provided, the first extrusion 1a tends to be larger and more complicated than necessary, and thus the number of fins 20 is preferably six or less. Furthermore, in the case of FIG. 8(B) in which four fins 20 are provided on the first extrusion 1a, increases in the manufacturing cost and the manufacturing difficulty can be more effectively significantly reduced or prevented as compared with the case in which five or six fins 20 are provided. In addition, the width of the base 10 can be made larger as compared with the case in which two fins 20 are provided, and thus the through-hole 15 can be easily made larger.

Figure 9:
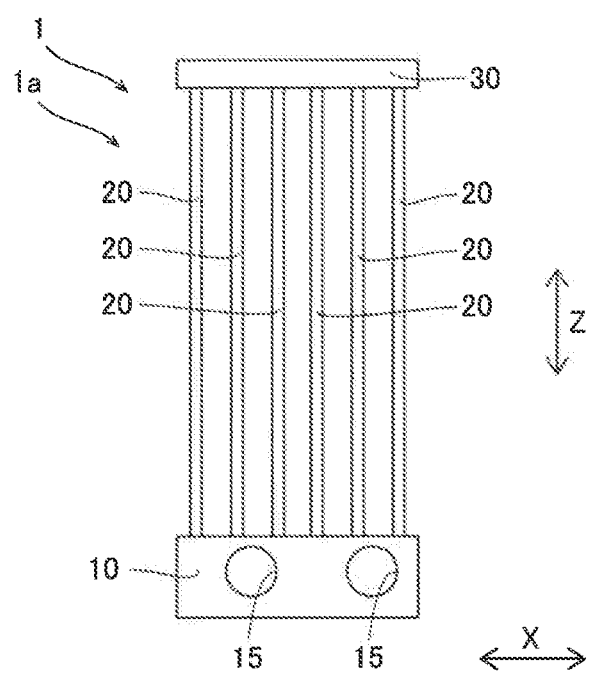
FIG. 9 is a diagram showing a modified example of a first extrusion, which includes a plurality of through-holes.

While the example of the first extrusion 1a including one through-hole 15 has been shown in the aforementioned embodiment, the present invention is not restricted to this. In the example of FIG. 9, the first extrusion 1a includes two through-holes 15. The shapes and sizes of the two through-holes 15 may be the same, or one or both of the shapes and sizes of the two through-holes 15 may be different. The two through-holes 15 are provided in the first extrusion 1a, and thus the maximum number of mountable heat pipes 50 and the number of mounting positions of the selectable heat pipes 50 can be increased while excessive complication of the structure is significantly reduced or prevented. The extrusion 1 (first extrusion 1a) may include three or more through-holes 15. However, when three or more through-holes 15 are provided in the first extrusion 1a, the first extrusion 1a tends to be larger and more complicated than necessary. When the heat pipes 50 are mounted in all the through-holes 15, the number of components increases, and thus the number of through-holes 15 is preferably one or two.

While the example in which all the plurality of extrusions 1 include the first extrusions 1a has been shown in the aforementioned embodiment, the present invention is not restricted to this. For example, as shown in FIG. 10, the first extrusion 1a including the through-hole 15 and the extrusion 1 in which the through-hole 15 is not formed may be provided.

While the example in which the extrusions 1 having the same shape (the first extrusions 1a having the same shape) are aligned and joined has been shown in the aforementioned embodiment, the present invention is not restricted to this. In the present invention, a plurality of types of extrusions 1 having different dimensions in the X direction may be provided. In FIG. 10, the plurality of extrusions 1 include a second extrusion(s) 1b including a base 10 having a width dimension different from that of the first extrusion 1a. The first extrusion 1a has a width dimension W11, and the second extrusion 1b has a width dimension W12 different from the width dimension W11. The width dimension W2 of the second extrusion 1b is smaller than the width dimension W1 of the first extrusion 1a. Therefore, the distance Dh between the adjacent through-holes 15 is not constant according to the number of second extrusions 1b interposed between the first extrusions 1a. For example, when there is a local heat generator 103 at a predetermined position inside the object to be cooled 102, and the temperature unevenness is likely to occur, for example, the distance Dh between the through-holes 15 is adjusted by the second extrusion 1b, and the heat pipe 50 is arranged at a position that overlaps the local heat generator 103 or in the vicinity of the position that overlaps the local heat generator 103.

Figure 10:
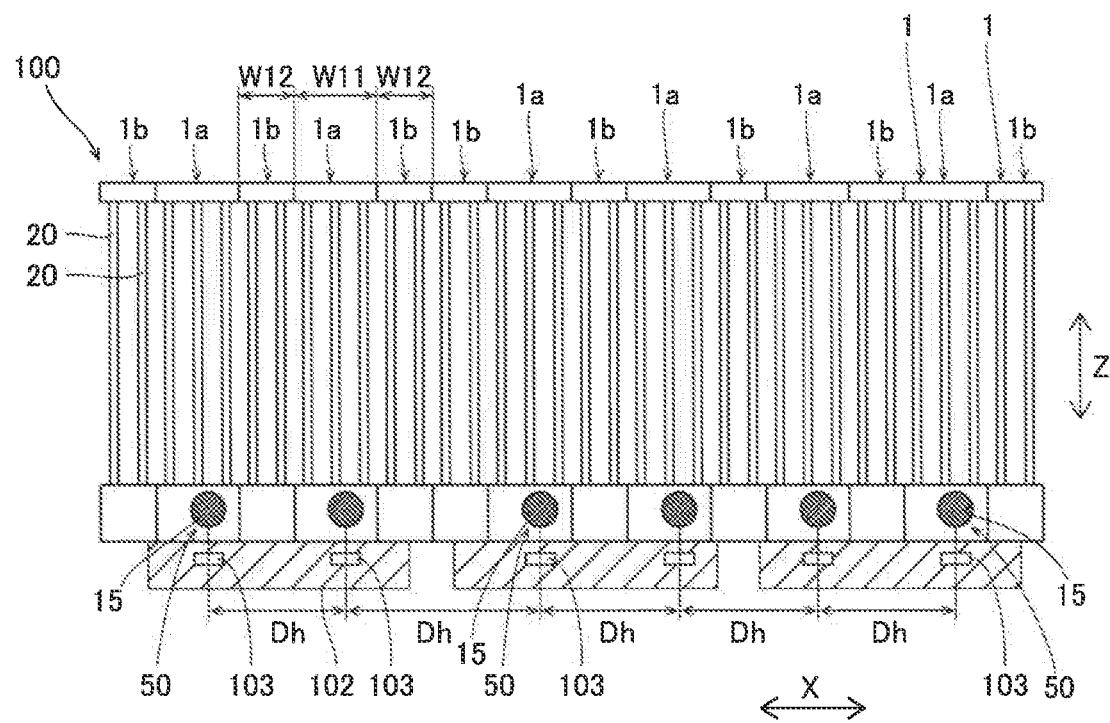
FIG. 10 is a schematic front view showing a modified example of a heat sink, which includes second extrusions.

Here, when a plurality of same first extrusions 1a are aligned as shown in FIG. 4, the distance Dh between the through-holes 15 is also constant, but as shown in FIG. 10, when the second extrusion 1b including the base 10 having a different width dimension is interposed between the first extrusions 1a, the distance Dh between the through-holes 15 can be changed. Therefore, the position of the through-hole 15 can be more precisely adjusted according to locations with different heat loads (the position that overlaps the heat generator 103) by adjusting not only the position of the first extrusion 1a in the arrangement of the plurality of extrusions 1 but also the position of the second extrusion 1b and/or the number of second extrusions 1b. Consequently, the local temperature rise of the heat sink 100 can be more effectively significantly reduced or prevented by adjusting the position of the through-hole 15 such that the through-hole 15 passes through the locations with different heat loads (the position that overlaps the heat generator 103) in the heat sink 100 and mounting the heat pipe 50 in the through-hole 15, the position of which has been adjusted.

Figure 11:
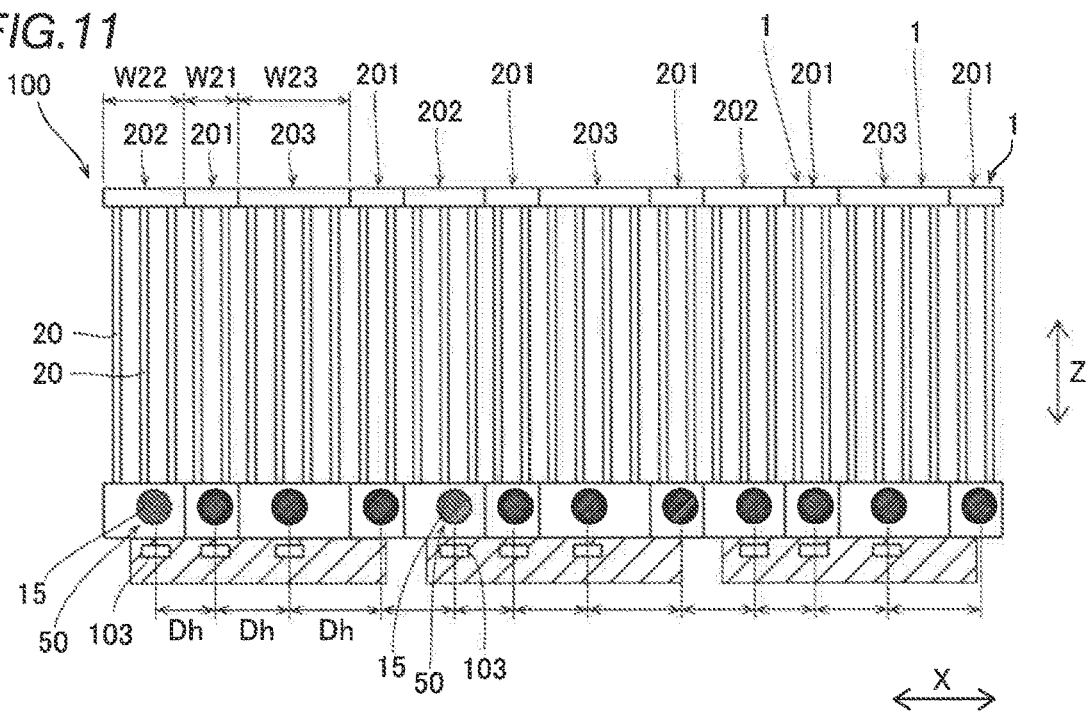
FIG. 11 is a diagram showing a modified example of a heat sink, which includes a plurality of first extrusions including different width dimensions.

When the plurality of first extrusions 1a are provided, a plurality of types of first extrusions 1a having different width dimensions may be provided. In FIG. 11, the extrusions 1 that constitute the heat sink 100 include a first extrusion 201 having a first width dimension W21, a first extrusion 202 having a second width dimension W22, and a first extrusion 203 having a third width dimension W23. The first extrusions 201 to 203 differ from each other in the number of fins 20. As a result of arranging the plurality of types of first extrusions 201 to 203 having different width dimensions, the distance Dh between the adjacent through-holes 15 is not constant. Also in this case, the position of the through-hole 15 can be more precisely adjusted according to the locations with different heat loads (the position that overlaps the heat generator 103) by adjusting the combination (number, arrangement order) of the first extrusions 201 to 203.

Figure 12:
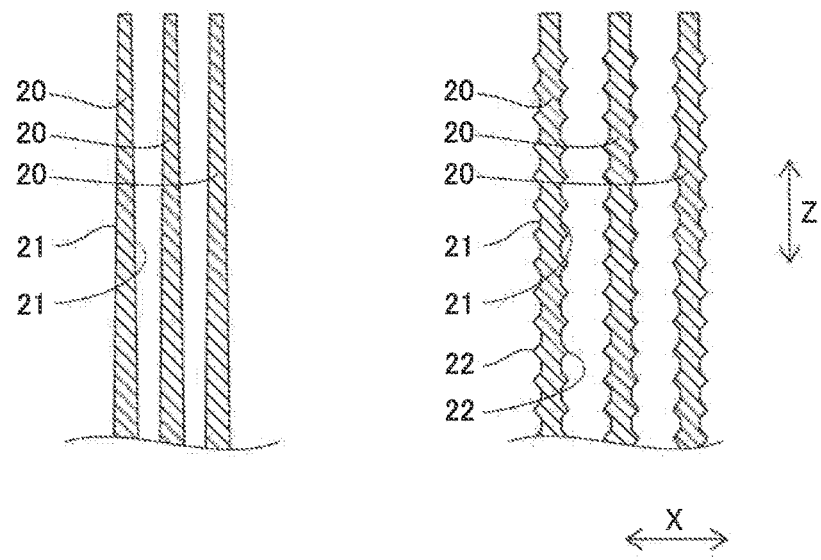
FIGS. 12A and 12B are diagrams showing a first modified example and a second modified example of fins.

While the example of the flat-plate shaped fins 20 has been shown in the aforementioned embodiment, the present invention is not restricted to this. In an example of FIG. 12(A), the fins 20 each have a tapered cross-sectional shape such that its thickness decreases toward its tip. The pair of side surfaces 21 are non-parallel. In an example of FIG. 12(B), the fins 20 each have convex portions 22 that protrude outward on the side surfaces 21. The convex portions 22 can increase the surface areas of the fins 20.

Figure 13:
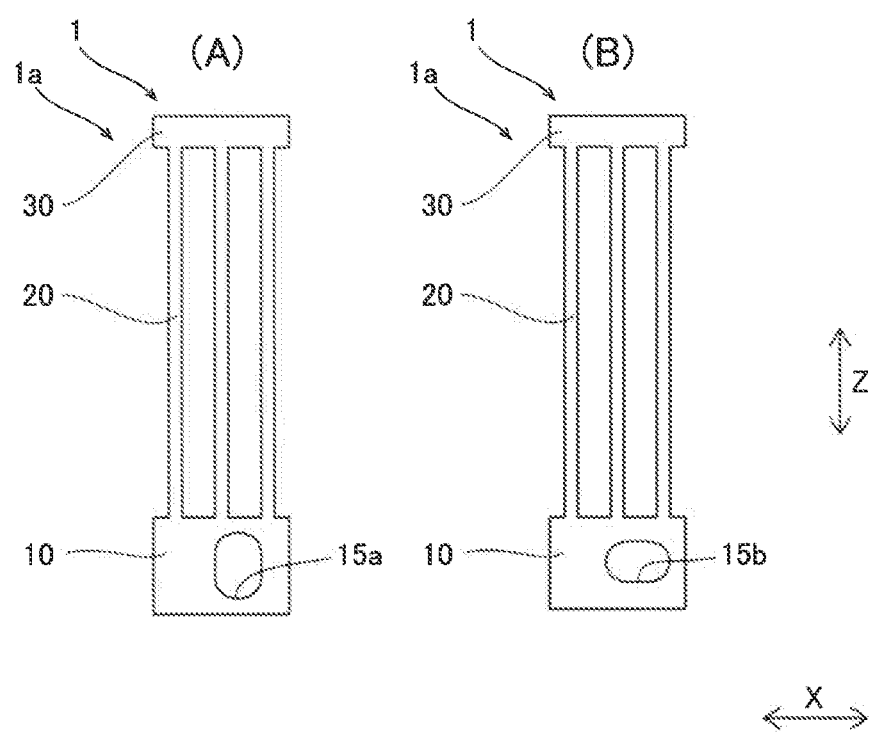
FIGS. 13A and 13B are diagrams showing a first modified example and a second modified example of a through-hole.

While the example of the circular through-hole 15 has been shown in the aforementioned embodiment, the present invention is not restricted to this. In FIG. 13(A), a through-hole 15a has a non-circular shape that extends in the Z direction. The through-hole 15a has an oval shape that extends in the Z direction. In FIG. 13(B), a through-hole 15b has a non-circular shape that extends in the X direction. The through-hole 15b has an oval shape that extends in the X direction. The cross-sectional shape of the through-hole may be a polygonal shape other than an oval shape, another elliptical shape other than a circular shape, etc.

While the example in which the extrusion 1 includes a plurality of fins 20 has been shown in the aforementioned embodiment, the present invention is not restricted to this. In the present invention, the extrusion other than the first extrusion may include only one fin.

DESCRIPTION OF REFERENCE NUMERALS

1: extrusion
1a, 201, 202, 203: first extrusion
1b: second extrusion
10: base
15, 15a, 15b: through-hole
20: fin
50: heat pipe
100: heat sink

The invention claimed is:
1. A heat sink comprising:
a plurality of heat pipes; and
a plurality of extrusions that are aligned in a width direction orthogonal to an extrusion direction and joined to each other; wherein
 the plurality of extrusions comprise a plurality of first extrusions each having a first base, a first fin that protrudes from the first base, and a through-hole in which one of the plurality of the heat pipes is mountable in the first base,
 the through-hole extends in the extrusion direction,
 each of the plurality of heat pipes is mounted in a respective through-hole, and
 the plurality of first extrusions is arranged in either a first configuration or a second configuration, such that distances between the adjacent through holes are not constant,
 wherein in the first configuration the plurality of extrusions further comprise a plurality of second extrusions each having a second base, a second fin that protrudes from the second base, and a width dimen- sion different from a width dimension of the plurality of first extrusions, the distances between the adjacent through-holes are adjusted by arrangements of the plurality of second extrusions, and the first extrusions and the second extrusions are joined to each other in the width direction by a brazing material arranged between side surfaces of the first extrusion and the second extrusion, and wherein in the second configuration plurality of first extrusions is comprised by a plurality of types of first extrusions having different width dimensions, the distances between adjacent through-holes are adjusted by arrangements of the plurality of types of first extrusions, and the plurality of types of first extrusions are joined to each other in the width direction by a brazing material arranged between a side surface of the plurality of types of first extrusions.

2. The heat sink according to claim 1, wherein a dimension of the through-hole in the width direction has a size equal to or larger than a pitch of the plurality of fins.

3. The heat sink according to claim 1, wherein each of the plurality of first extrusions includes one or two through-holes.

4. The heat sink according to claim 1, wherein the plurality of first extrusions each include six or less fins.

5. The heat sink according to claim 4, wherein the first extrusion includes three or four fins and the first base including one or two through-holes formed therein.

6. The heat sink according to claim 1,
wherein the first fin is formed integrally with the first base, and
wherein the second fin is formed integrally with the second base.

* * * * *